(12) United States Patent
Sharp et al.

(10) Patent No.: US 7,553,740 B2
(45) Date of Patent: Jun. 30, 2009

(54) STRUCTURE AND METHOD FOR FORMING A MINIMUM PITCH TRENCH-GATE FET WITH HEAVY BODY REGION

(75) Inventors: Joelle Sharp, Herriman, UT (US); Gordon K. Madson, Herriman, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 161 days.

(21) Appl. No.: 11/140,567

(22) Filed: May 26, 2005

(65) Prior Publication Data

US 2006/0267088 A1 Nov. 30, 2006

(51) Int. Cl.
*H01L 21/76* (2006.01)
(52) U.S. Cl. ................ 438/424; 257/328; 257/330; 257/331; 438/429
(58) Field of Classification Search .......... 257/331, 257/330, 328, 329, 341; 438/412, 413, 416, 438/421, 424, 426, 430, 435, 270, 272, 269, 438/429, 268, 271, 273, 274, 525
See application file for complete search history.

(56) References Cited

U.S. PATENT DOCUMENTS

| | | |
|---|---|---|
| 3,930,300 A | 1/1976 | Nicolay |
| 4,296,429 A | 10/1981 | Schroeder |
| 4,414,242 A | 11/1983 | Nishimura et al. |
| 4,754,310 A | 6/1988 | Coe |
| 4,859,621 A | 8/1989 | Einthoven |
| 5,122,851 A | 6/1992 | Solomon |
| 5,148,247 A | 9/1992 | Miura et al. |
| 5,198,376 A | 3/1993 | Divakaruni et al. |
| 5,256,566 A | 10/1993 | Bailey |
| 5,310,698 A | 5/1994 | Wild |
| 5,354,701 A | 10/1994 | Chao |
| 5,366,914 A | 11/1994 | Takahashi et al. |
| 5,416,736 A | 5/1995 | Kosa et al. |
| 5,430,315 A | 7/1995 | Rumennik |
| 5,854,500 A | 12/1998 | Krautschneider |
| 5,885,878 A | 3/1999 | Fujishima et al. |
| 6,020,600 A | 2/2000 | Miyajima et al. |
| 6,022,786 A | 2/2000 | Franosch et al. |

(Continued)

FOREIGN PATENT DOCUMENTS

DE      197 48 523      5/1999

(Continued)

*Primary Examiner*—Zandra Smith
*Assistant Examiner*—Paul E Patton
(74) *Attorney, Agent, or Firm*—Townsend and Townsend and Crew LLP

(57) ABSTRACT

A field effect transistor is formed as follows. Openings are formed in a masking layer extending over a surface of a silicon region. A trench is formed in the silicon region through each opening in the masking layer. A layer of silicon is formed along sidewalls and bottom of each trench and along masking layer sidewalls which define each opening. The masking layer is removed to expose surface areas of the silicon region underlying the masking layer and to expose sidewalls of the layer of silicon to thereby form contact openings over the surface of the silicon region. A contact layer is formed to electrically contact the exposed surface areas of the silicon region and the exposed sidewalls of the layer of silicon.

32 Claims, 9 Drawing Sheets

U.S. PATENT DOCUMENTS

| | | | |
|---|---|---|---|
| 6,040,600 A | 3/2000 | Uenishi et al. | |
| 6,057,558 A | 5/2000 | Yamamoto et al. | |
| 6,114,730 A * | 9/2000 | Tani | 257/353 |
| 6,184,555 B1 | 2/2001 | Tihanyi et al. | |
| 6,252,277 B1 * | 6/2001 | Chan et al. | 257/330 |
| 6,255,190 B1 | 7/2001 | Kroner | |
| 6,291,310 B1 * | 9/2001 | Madson et al. | 438/424 |
| 6,316,806 B1 * | 11/2001 | Mo | 257/330 |
| 6,316,807 B1 | 11/2001 | Fujishima et al. | |
| 6,337,499 B1 | 1/2002 | Werner | |
| 6,984,864 B2 * | 1/2006 | Uno et al. | 257/382 |
| 2003/0209750 A1 | 11/2003 | Deboy et al. | |
| 2005/0167742 A1 * | 8/2005 | Challa et al. | 257/328 |

FOREIGN PATENT DOCUMENTS

| | | |
|---|---|---|
| JP | 02-045973 | 2/1990 |
| JP | 07-099241 | 4/1995 |
| JP | 09-036323 | 2/1997 |
| WO | WO 97/29518 | 8/1997 |

* cited by examiner

STRUCTURE AND METHOD FOR FORMING A MINIMUM PITCH TRENCH-GATE FET WITH HEAVY BODY REGION

BACKGROUND OF THE INVENTION

The present invention relates in general to semiconductor power field effect transistors (FETs), and more particularly to a method and structure for forming a minimum pitch trench-gate FET with heavy body regions.

A cross-sectional view of a conventional trench-gate power MOSFET 10 is shown in FIG. 1. MOSFET 10 includes an n-type substrate 101 on which an n-type epitaxial layer 102 is grown. Substrate 101 embodies the drain of MOSFET 10. A p-type body region 108 extends into epitaxial layer 102. Trenches 113 extend through body region 108 and into the portion of epitaxial layer 102 bounded by body region 108 and substrate 101 (commonly referred to as the drift region). A gate dielectric layer 131 is formed on the sidewalls and bottom of each trench 113. Source regions 110 flank trenches 131. Heavy body regions 137 are formed within body region 108 between adjacent source regions 110. Gate electrodes 132 (e.g., from polysilicon) fill trenches 131 and embody the gate of MOSFET 10. Dielectric cap 133 covers trenches 113 and also partially extends over source regions 110. A top-side metal layer 139 electrically contacts source regions 110 and heavy body regions 137. A bottom-side metal layer (not shown) contacts substrate 101.

To increase the transistor packing density, it is desirable to minimize the trench width as well as the mesa width (i.e., the spacing between adjacent trenches). However, both of these dimensions are limited by constraints imposed by manufacturing equipment, structural requirements, misalignment tolerances, and transistor operational requirements. For example, the minimum width of the mesa region between adjacent trenches 113 in FIG. 1 is limited by the space required for forming source regions 110 and heavy body regions 137. Misalignment tolerances associated with forming heavy body regions 137 further increase the mesa width.

Many techniques for reducing the cell pitch of trench-gate FETs have been proposed, but none have been able to achieve a substantial reduction in the cell pitch without significantly complicating the manufacturing process. For example, one method for reducing the cell pitch has been the use of spacers to obtain self-aligned features. However, this method requires additional process steps to form and then remove the spacers. Further, the spacer method involves etching of silicon to obtain recessed heavy body regions. The process steps associated with etching silicon and repairing the damaged silicon surfaces further complicates the manufacturing process.

Thus, there is a need for a technique whereby the cell pitch of trench-gate FETs can be significantly reduced while maintaining a simple manufacturing process.

BRIEF SUMMARY OF THE INVENTION

In accordance with an embodiment of the invention, a field effect transistor is formed as follows. Openings are formed in a masking layer extending over a surface of a silicon region. A trench is formed in the silicon region through each opening in the masking layer. A layer of silicon is formed along sidewalls and bottom of each trench and along masking layer sidewalls which define each opening. The masking layer is removed to expose surface areas of the silicon region underlying the masking layer and to expose sidewalls of the layer of silicon to thereby form contact openings over the surface of the silicon region. A contact layer is formed to electrically contact the exposed surface areas of the silicon region and the exposed sidewalls of the layer of silicon.

In one embodiment, the masking layer comprises a composite layer of oxide-nitride-oxide (ONO).

In another embodiment, source regions extending into the silicon layer are formed by implanting impurities at an angle greater than 20° from the dimension parallel to trench sidewalls.

In accordance with another embodiment of the invention, a field effect transistor is formed as follows. Trenches are formed in a silicon region using a masking layer. The trenches extend from a surface of the silicon region to a predetermined depth in the silicon region. Portions of the masking layer are removed to expose surface areas of the silicon region adjacent each trench. A layer of silicon is formed along sidewalls and bottom of each trench. The layer of silicon further extends out of each trench and over the exposed surface areas of the silicon region adjacent each trench. The layer of silicon abuts sidewalls of the masking layer remaining after the removing step. The remaining masking layer is removed to thereby form contact openings over the surface of the silicon region, the contact openings being defined by exposed sidewalls of the layer of silicon.

In one embodiment, the masking layer comprises oxide.

In another embodiment, source regions extending into the silicon layer are formed by implanting impurities at an angle greater than 20° from the dimension parallel to trench sidewalls.

In accordance with another embodiment of the invention, a field effect transistor includes a pair of trenches extending into a silicon region. A layer of silicon extends along the sidewalls and bottom of each trench. The layer of silicon further extends out of each trench but is discontinuous over a surface of the silicon region so as to form a contact opening over the surface of the silicon region between the pair of trenches.

In one embodiment, the field effect transistor further includes a gate dielectric layer lining sidewalls and bottom of the layer of silicon in each trench. A gate electrode is over the gate dielectric. Source regions flank each side of the gate electrode in each trench. At least a portion of each source region is formed in the layer of silicon such that sidewalls of adjacent source regions define the contact opening.

In accordance with another embodiment of the invention, a field effect transistor includes a plurality of trenches extending into a silicon region. A layer of silicon lines sidewalls and bottom of each trench, and extends out of each trench but is discontinuous over a surface of the silicon region so as to form a contact opening over the surface of the silicon region between adjacent trenches. A gate dielectric layer lines sidewalls and bottom of the layer of silicon in each trench. A gate electrode is over the gate dielectric in each trench. Source regions of a first conductivity type extend into the layer of silicon.

The following detailed description and the accompanying drawings provide a better understanding of the nature and advantages of the present invention.

DETAILED DESCRIPTION OF THE INVENTION

In accordance with embodiments of the present invention, a trench-gate FET cell structure is obtained which includes a heavy body region and has a pitch limited only by the capabilities of the photolithography tools, using a simple manufacturing process. Recessed heavy body regions are formed using a silicon layer which lines the trench sidewalls and bottom but is discontinuous over the mesa region. Thus, recessed heavy body regions are formed without etching silicon which simplifies the overall process.

Figure 1:
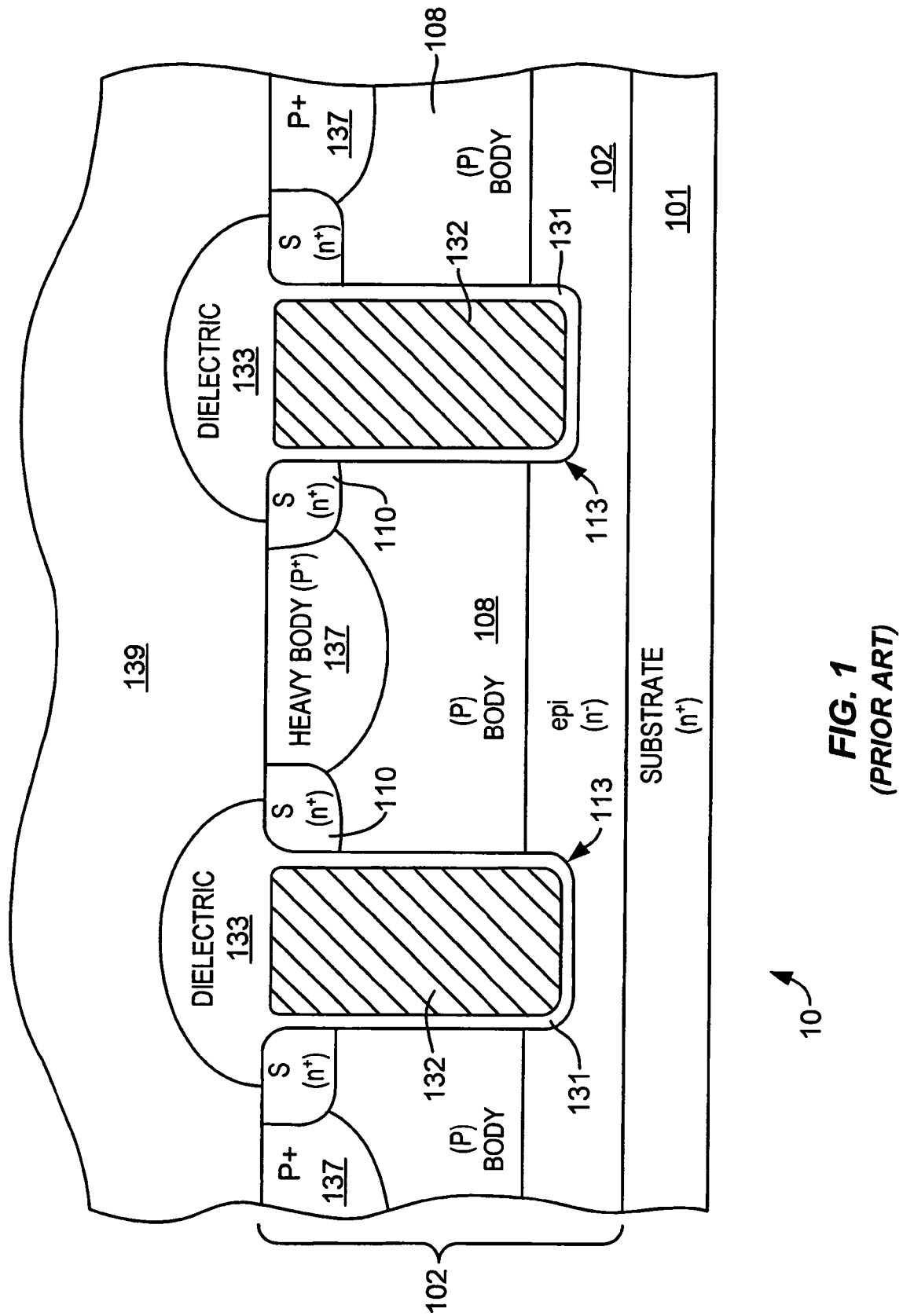
FIG. 1 shows a cross-section view of a conventional trench-gate MOSFET.
Figure 2A:
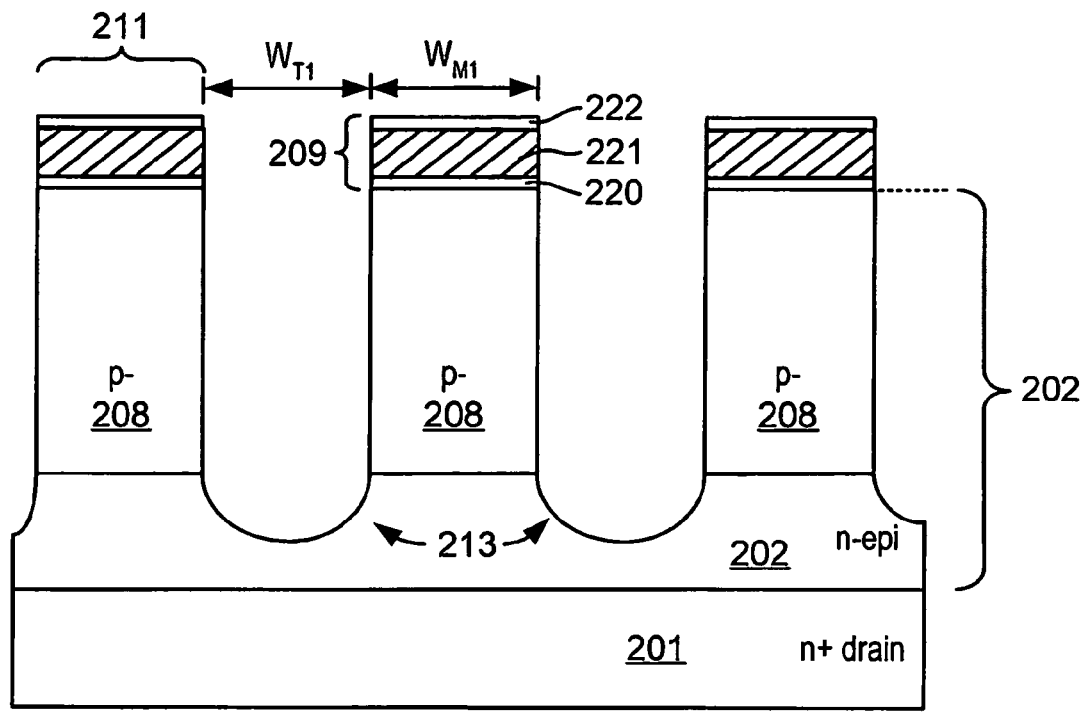
FIGS. 2A-2G are cross-section views illustrating a simplified process flow for manufacturing a trench-gate FET characterized by a minimum cell pitch including heavy body regions, according to an embodiment of the present invention.

FIGS. 2A-2G are cross-section views illustrating a simplified process flow for manufacturing a trench-gate FET, according to an embodiment of the present invention. In FIG. 2A, an n-type epitaxial layer 202 is formed over an n-type substrate 201 using conventional techniques. A p-type body region 208 is formed in epitaxial layer 202 by implanting and diffusing dopants of p-type conductivity into epitaxial layer 202.

A masking layer composed of an oxide-nitride-oxide composite layer is formed on top of body region 208. Bottom oxide layer 220 and top oxide layer 222 may be formed by any one of a number of methods, such as, thermal oxidation, low-pressure chemical vapor deposition, and plasma enhanced chemical vapor deposition. Similarly, nitride layer 221 may be formed by any one of a number of methods, such as low-pressure chemical vapor deposition and plasma enhanced chemical vapor deposition nitride. The masking layer is patterned to define openings through which trenches 213 are formed. Sections of the ONO masking layer, or ONO stacks 209, remain over mesa regions 211. The bottom oxide layer 220 is a pad oxide and serves as a nitride etch stop layer, and provides stress relief. The top oxide layer 222 serves as an etch stop layer for the trench etch chemistry. Masking layer 209 must be thick enough to withstand trench etch duration.

A conventional anisotropic silicon etch is performed to etch trenches extending through body region 208 and terminating below the bottom surface of body region 208. Cells of alternating trenches 213 and mesas 211 are thus formed, where width $W_{T1}$ of trenches 213 and width $W_{M1}$ of mesas 211 are minimum dimensions limited only by the capabilities of the photolithography tools used. In one embodiment, $W_{T1}$ and $W_{M1}$ are equal to 0.35 μm. The depth to which the trenches extend in part depends on the thickness of a silicon layer that will be formed inside the trench in a later step.

An anneal process is then performed. In one embodiment, the anneal is performed using hydrogen gas at a temperature of approximately 1100° C. and a pressure of approximately 100 Torr as described in the commonly-assigned U.S. Pat. No. 6,825,087, entitled "Hydrogen Anneal for Creating an Enhanced Trench for Trench MOSFETs," incorporated herein by reference in its entirety. The anneal step has the effect of not only reducing the defect density of the base silicon layer but it also has the effect of causing the upper and lower corners of trenches 213 to become rounded. Although FIGS. 2A-2G show rounding of only the lower trench corner, such is also the case for the upper trench corners. Other temperatures and pressures can also be used in the anneal process.

Figure 2B:
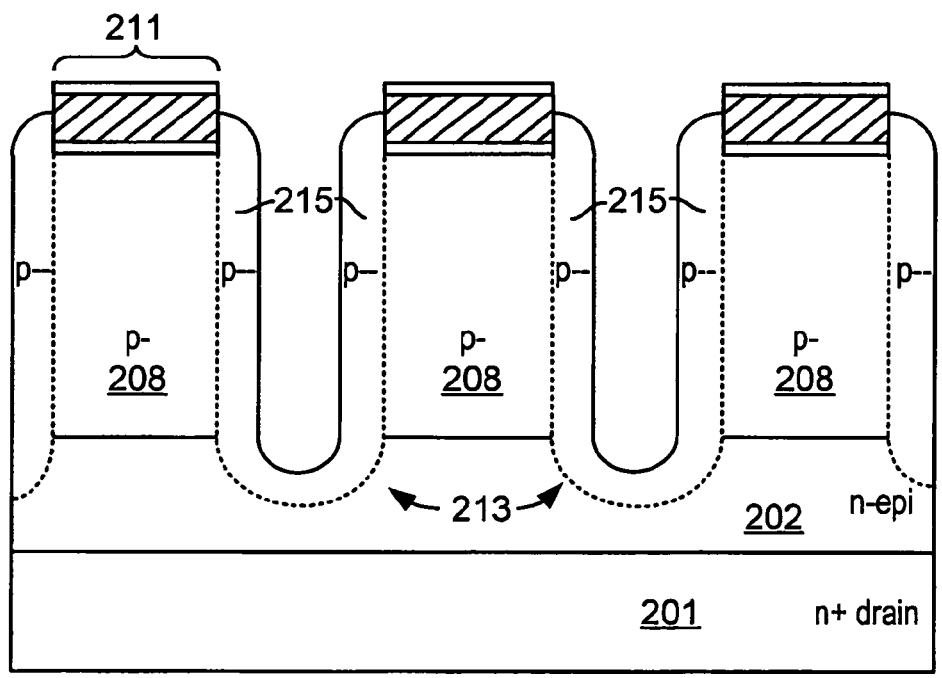

In FIG. 2B, a high-quality layer of silicon 215 is formed on the sidewalls and bottom of trenches 213 and up the sidewalls of ONO stacks 209. In one embodiment, a selective epitaxial growth (SEG) process is used to form silicon layer 215. During the silicon layer deposition, silicon atoms bond to any other available silicon atom such that as the epitaxial layer grows toward the center of the trench it also grows upward and thus extends along sidewalls of the ONO stacks.

An exemplary method for forming silicon layer 215 is described in the commonly-assigned U.S. Pat. No. 6,291,310, titled "Method of increasing trench density for semiconductor," incorporated herein by reference in its entirely. In one embodiment, the thickness of silicon layer 215 is between 500-1,000 Å, although other thicknesses may be used depending on the desired final mesa width and final trench width. Silicon layer 215 advantageously serves as an undamaged silicon surface suitable for gate oxide growth. Also, in one embodiment, masking layer 209 is made thicker than the depth of a heavy body trench (formed in later process steps) to ensure that during the process of growing silicon layer 215, no silicon is formed over the top of masking layer 209.

Silicon layer 215 may be an intrinsic (undoped) layer or a doped layer. An intrinsic silicon layer 215 advantageously results in formation of better quality gate dielectric. Out-diffusion of dopants from neighboring regions of silicon layer 215 into silicon layer 215 during various temperature cycles in the process ensures that upon completion of the FET structure the portion of silicon layer 215 extending along the bottom of the trenches is n-type (receiving n-type dopants from drift region 202), while the portions of silicon layer 215 extending along the trench sidewalls is p-type (receiving p-type dopants from body region 208).

Alternatively, silicon layer 215 may be doped to have the same or opposite conductivity type as the body region. In the FIG. 2A-2G embodiment, silicon layer 215 is formed to be p-type and lightly doped (FIG. 2B). The doping concentration of silicon layer 215 needs to be carefully selected so that upon completion of the FET structure, the portion of silicon layer 215 extending along the bottom of the trenches becomes n-type (due to the counter-doping effect of the out-diffusion from drift region 202). An alternative approach is to use a 0° implant of n-type impurities to convert to n-type the conductivity type of the portion of silicon layer 215 extending along the trench bottom, while the portions of the silicon layer extending along trench sidewalls remain p-type. This advantageously enables selecting a higher initial p-type doping concentration for silicon layer 215. In the embodiment where silicon layer 215 is doped to have opposite conductivity type (i.e., n-type in FIG. 2B) to the body region, the doping of silicon layer 215 needs be carefully selected so that upon completion of the FET structure, the portion of silicon layer 215 extending along trench sidewalls becomes p-type (due to the counter-doping effect of the out-diffusion from body region 208).

Figure 2C:
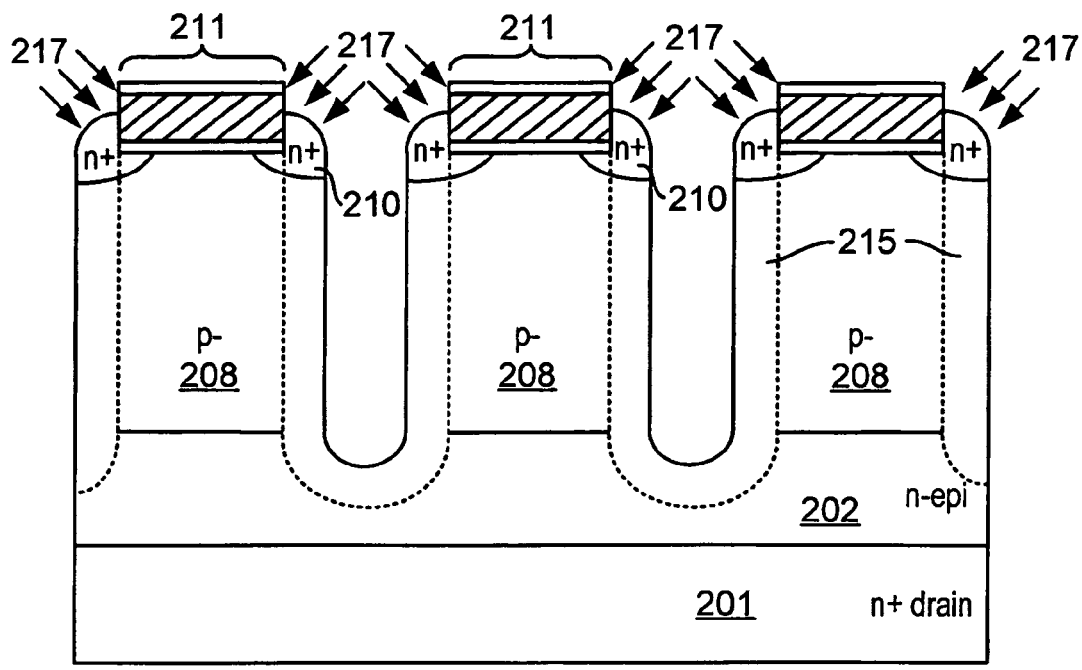

In FIG. 2C, a two pass angled implant 217 and subsequent diffusion is carried out to form n-type source regions 210 adjacent hard mask sections 209. Nitride layer 221 in the composite hard mask sections 209 blocks the middle section of mesa 211 from receiving implant 217. Implanting at an angle helps prevent implant ions from penetrating too far into the channel region. In one embodiment of the invention, the implant angle is greater than 20° (for example, 45°) from the dimension parallel to trench sidewalls. Source regions 210 are thus formed directly adjacent each side of and extend slightly below ONO stacks 209. In an alternative approach to the angled implant, the same 0° implant for converting to n-type the portion of silicon layer 215 extending along the trench bottom, may be used to form source regions 210.

Following the source implant, a thin gate dielectric (e.g., oxide) 231 is formed to line the sidewalls and bottom of silicon layer 215 using conventional techniques. Because gate dielectric 231 is formed over a high quality silicon layer 215, gate dielectric 231 is of higher quality than in conventional FETs. A recessed gate electrode 232 is then formed over gate dielectric 231 in trenches 213. In an alternate embodiment, source implant 217 is carried out after gate electrodes 232 rather than before.

Figure 2D:
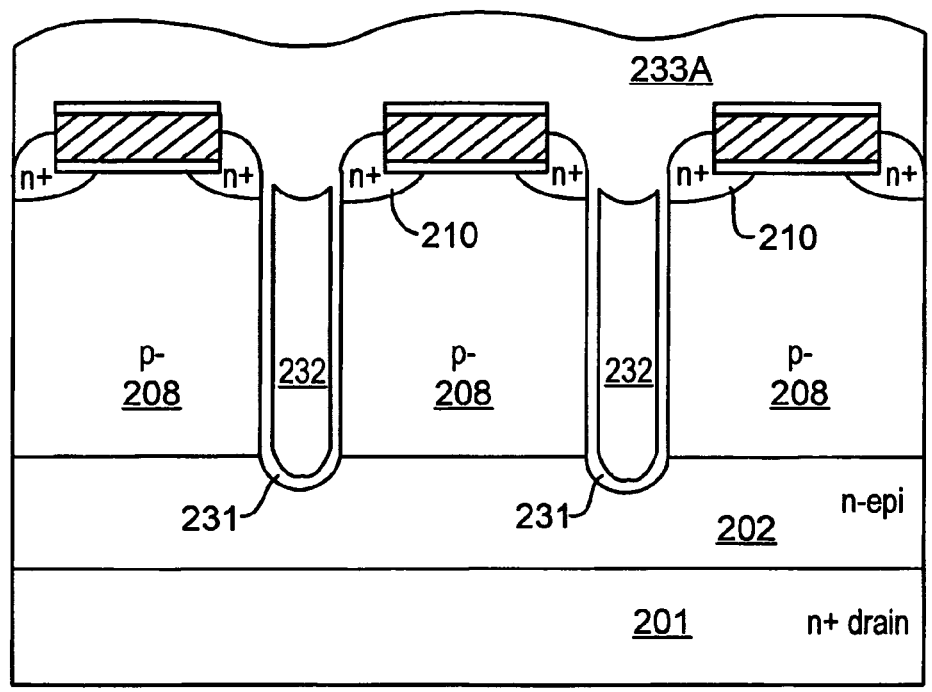

A dielectric layer 233A is then formed over the structure, as shown in FIG. 2D. In one embodiment, dielectric layer 233A is from borophosphosilicate glass (BPSG), but may also be from any material exhibiting generally nonconductive properties, such as silicon dioxide ($SiO_2$). BPSG is more commonly used because heat treatment to BPSG in a 'reflow' process allows the shape of the BPSG layer to shift so as to obtain good step coverage with minimum amount of voiding.

Figure 2E:
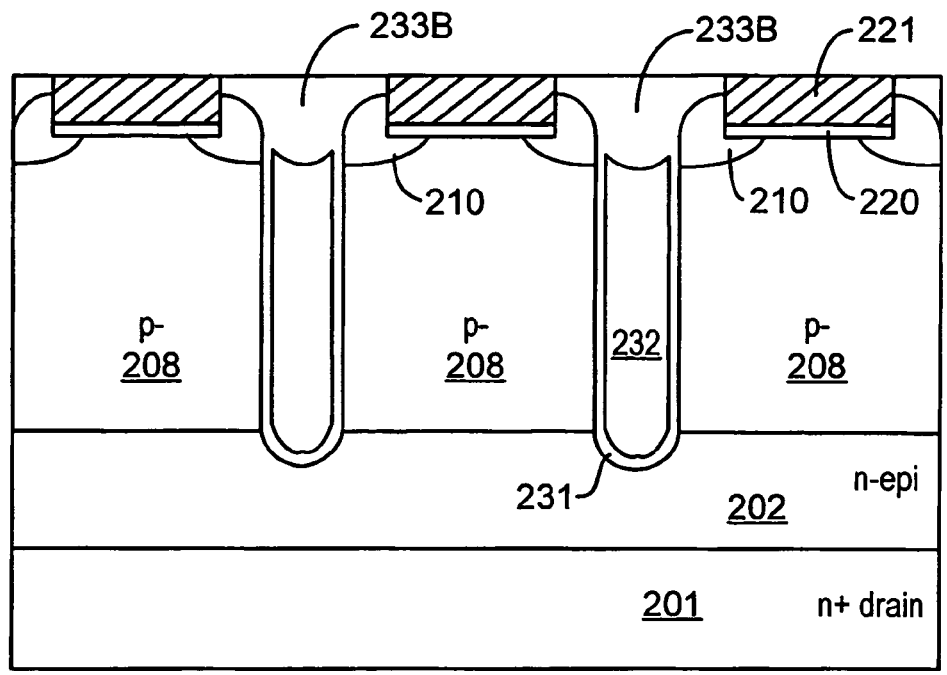

In FIG. 2E, dielectric layer 233A and the top oxide 222 in ONO stacks 209 are etched to obtain a substantially planar surface which is even with the top of nitride layer 221. An oxide etch with nitride layer 221 as an etch stop may be used. A controlled chemical mechanical polish (CMP) process may alternatively be used.

Figure 2F:
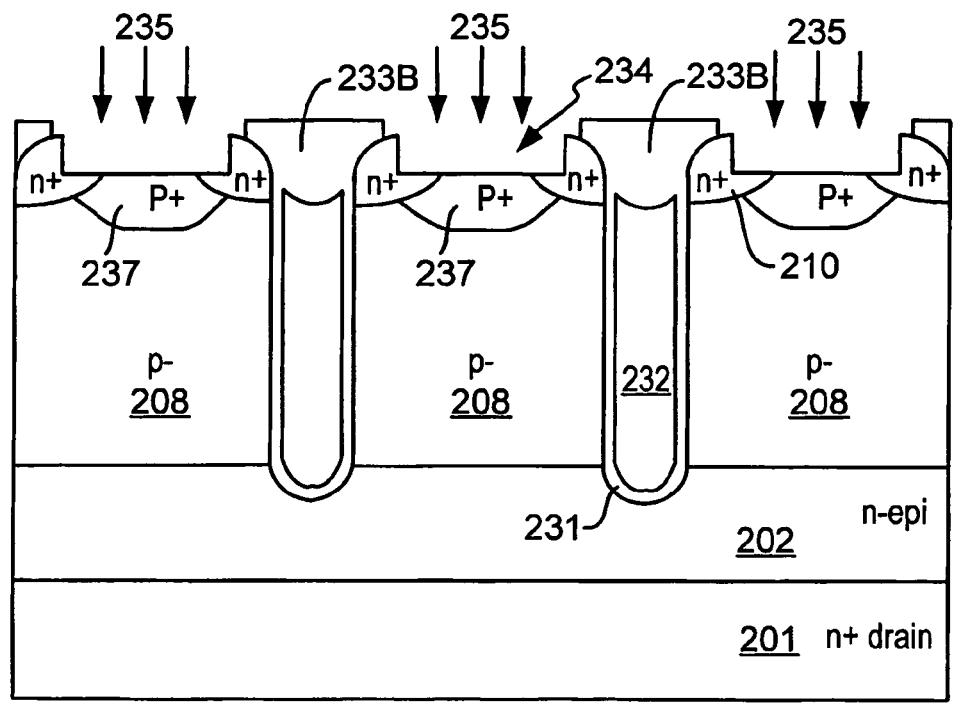

In FIG. 2F, nitride layer 221 and pad oxide 220 of ONO stacks 209 are removed, thus forming recessed self-aligned heavy body contact openings 234 directly over each mesa region 211. Conventional techniques may be used to remove nitride layer 221 and pad oxide 220. Removal of pad oxide 220 results in removal of an insignificant amount of dielectric layer 233. As can be seen, openings 234 have a smaller width than what the photolithography equipments are capable of resolving.

A conventional implant 235 is carried out to form p-type heavy body regions 237 in body regions 208 through contact openings 234. The dielectric cap 233B over each trench blocks gate electrode 232, gate dielectric 231, and a substantial portion of source regions 210 from implant 235. Heavy body regions 237 extend partially below each of the source regions 210 and are deepest along the middle of contact openings 234. As can be seen, unlike conventional methods, no silicon etch was required to form the recessed heavy body regions 237.

Figure 2G:
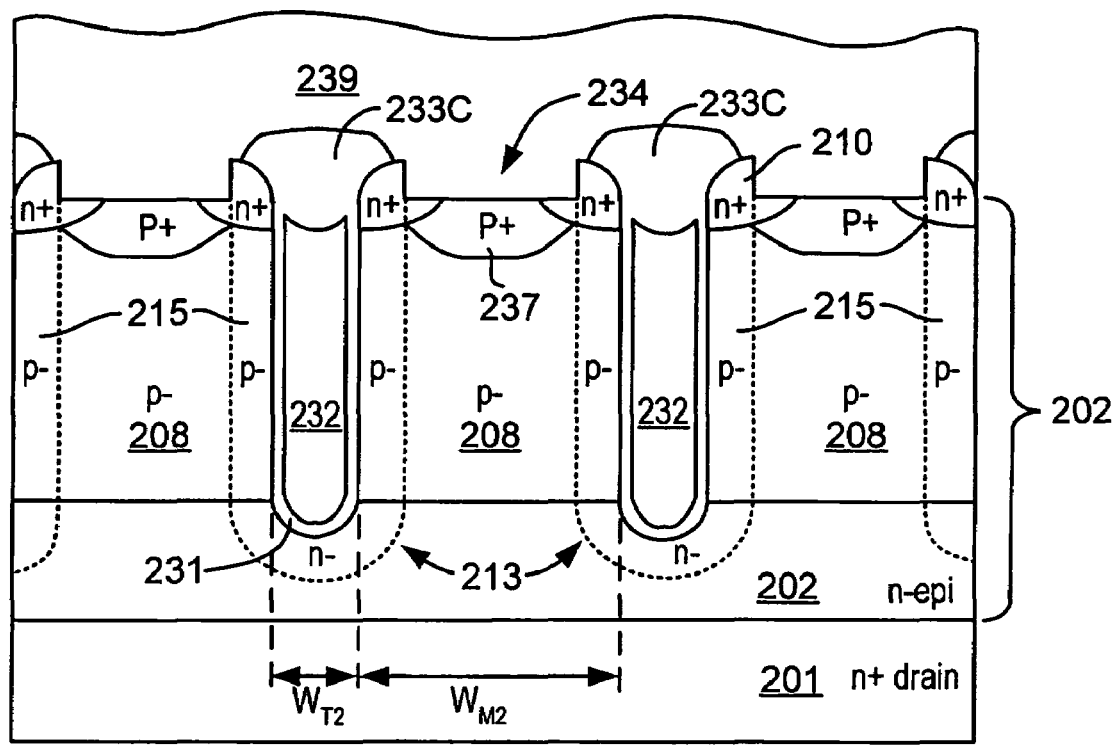

In FIG. 2G, a conventional BPSG reflow process is performed to round out the dielectric caps 233B to ensure good step coverage for the top-side metal layer 239 formed next. Metal layer 239 fills the contact openings and electrically contacts source regions 210 (primarily along their sidewalls) and heavy body regions 232. The remaining process steps to complete the device would be similar to conventional methods and thus will not be described. The structure as shown in FIG. 2G shows the outlines of silicon layer 215. As indicated in the figure, portions of silicon layer 215 extending along trench sidewalls are p-type, while the portions extending along trench bottom are n-type. Also, a comparison of FIG. 2G to FIG. 2A reveals that an initial trench width $W_{T1}$ and mesa width $W_{M1}$ are respectively changed to a smaller effective trench width $W_{T2}$ and a larger effective mesa width $W_{M2}$. Accordingly, despite the extremely small cell pitch (limited only by the capabilities of the photolithography tools), a FET structure which includes heavy body regions has been obtained. Another physical attribute of the final FET structure as shown in FIG. 3G is that the effective trench width $W_{T2}$ and the contact opening 234 are both smaller than what the photolithography tools are capable of resolving.

FIGS. 3A-3H are cross-section views illustrating an alternative process flow for manufacturing a trench-gate FET characterized by a minimum cell pitch with heavy body regions, according to another embodiment of the present invention. Many of the process steps, variations, and considerations in carrying out the processing steps represented by FIGS. 3A-3H are similar to those in the embodiment of FIGS. 2A-2G.

Figure 3A:
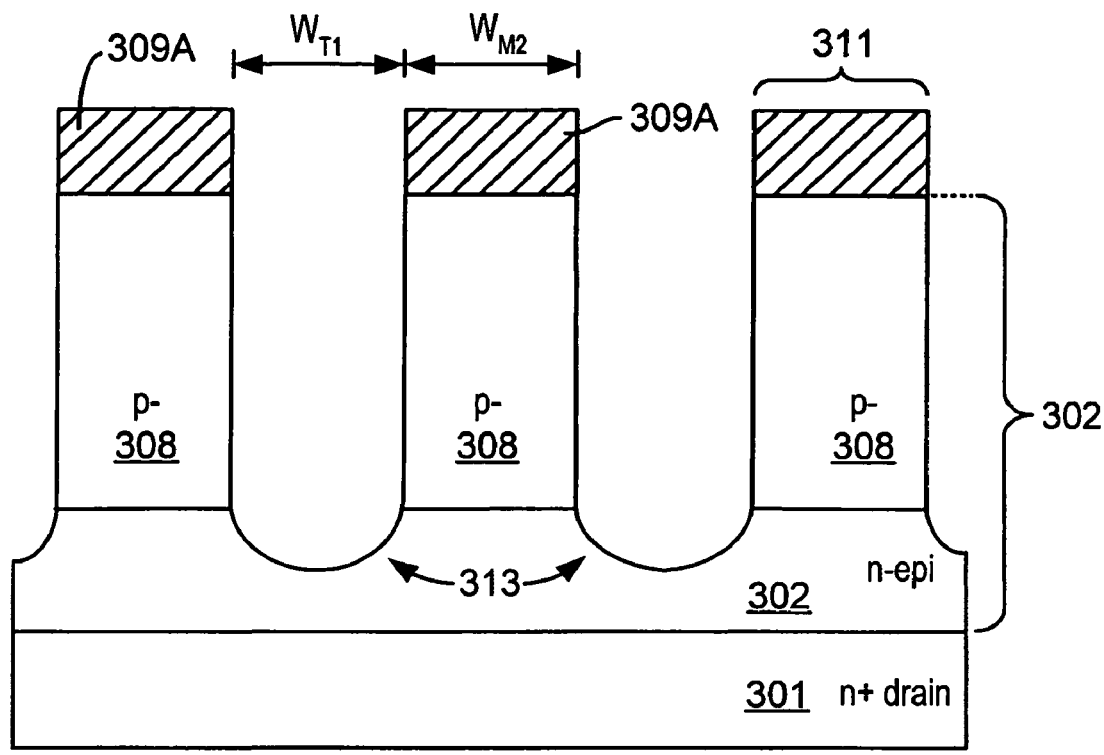
FIGS. 3A-3H are cross-section views illustrating an alternative process flow for manufacturing a trench-gate FET characterized by a minimum cell pitch including heavy body regions according to another embodiment of the present invention.

In FIG. 3A, n-type epitaxial layer 302 and p-type body region 308 are formed over n-type substrate 301 in a similar manner to those in the first embodiment. A masking layer is used to form trenches in accordance with conventional techniques. Hard mask sections 309A define openings through which silicon is etched to thereby form trenches 313 which extend through body region 308 and into epitaxial layer 302. The hard mask can be from any material capable of withstanding high temperatures (e.g., greater than 900° C.) such as oxide. This characteristic of the masking layer is necessitated by the high temperature process associated with a later step wherein a silicon layer is grown. As in the first embodiment, the trench width $W_{T1}$ and the mesa width $W_{M1}$ are set to the smallest dimension limited only by the capabilities of the photolithography equipment used, thus obtaining a substantially reduced cell pitch.

Figure 3B:
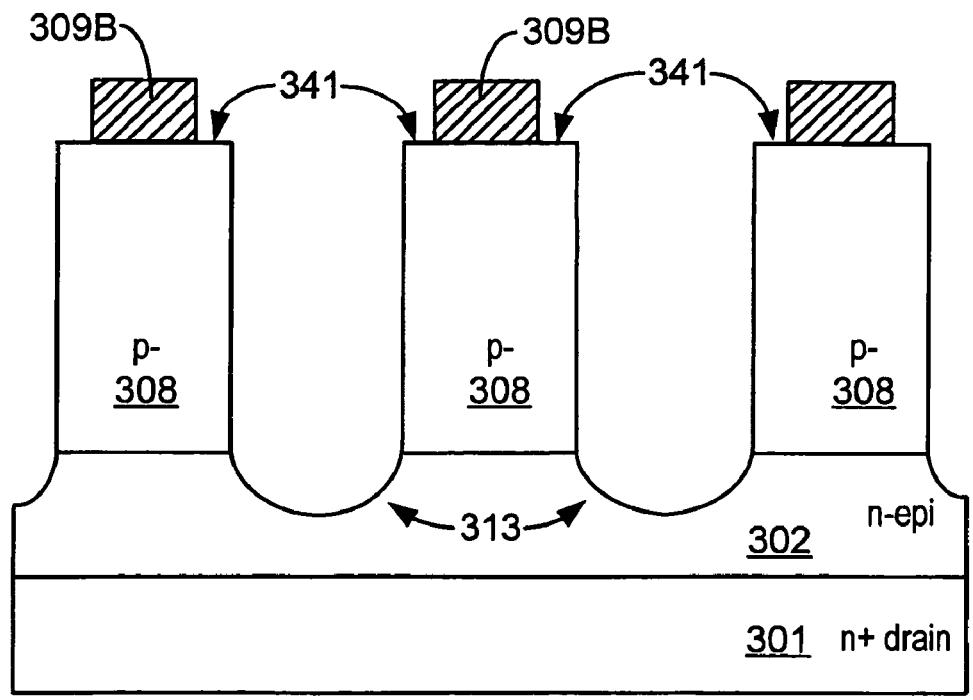

In FIG. 3B, in the embodiment wherein the hard mask is from oxide, a conventional wet etch process is used to remove a portion of hard mask sections 309A so that surface areas 341 of body region 308 become exposed. The thickness of the hard mask and the wet etch process need to be designed to ensure that the desired amount of surface area 341 is exposed. In one embodiment, the desired width of the heavy body contact area dictates the extent to which the mesa surface area 341 needs to be exposed (i.e., the width of the remaining hard mask sections 309A defines the heavy body contact width).

As in the first embodiment, an anneal process is carried out to reduce the defect density of the base silicon layer and to cause the upper and lower corners of trenches 313 to become rounded. The anneal may be performed before or after the wet etch step. Although FIGS. 3A-3H show rounding of only the lower trench corner, such is also the case for the upper trench corners.

Figure 3C:
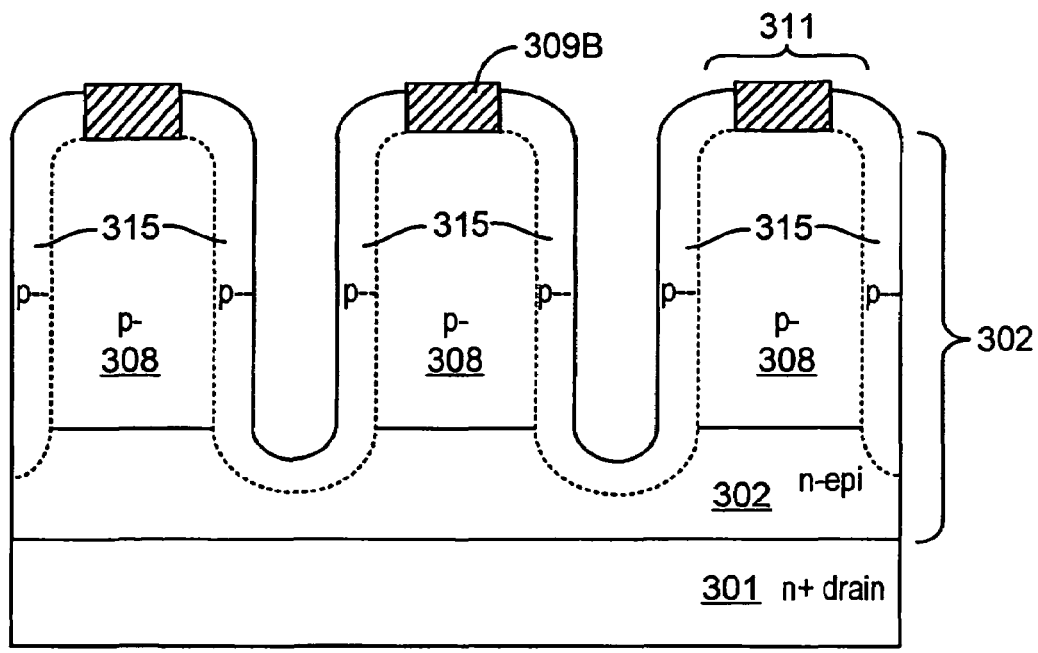

In FIG. 3C, a high-quality layer of silicon 315 is formed on the sidewalls and bottom of trenches 313 and over exposed surface areas 341 of body region 308. Selective epitaxial deposition process may be used to form silicon layer 315, in a similar manner to the first embodiment described above. The same considerations related to the silicon layer being doped or undoped discussed above also applies to the present embodiment.

Figure 3D:
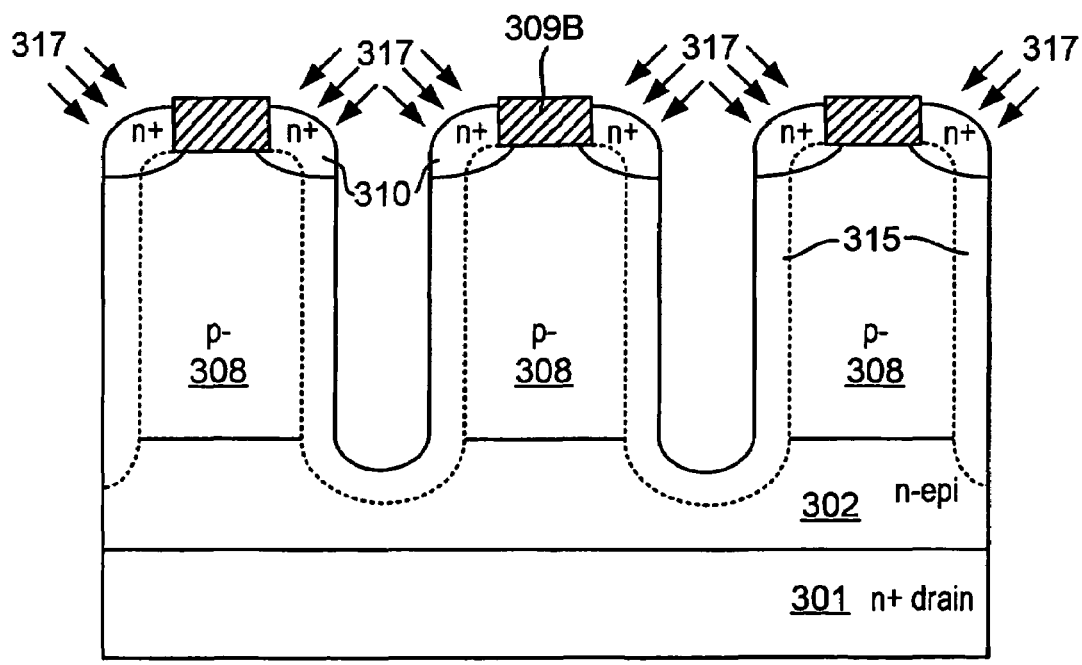

In FIG. 3D, a two-pass angled implant 317 and diffusion process are carried out to form source regions 310 in a similar manner to that described above for the first embodiment. The same considerations in carrying out the angled implant described above also apply to the present embodiment.

Figure 3E:
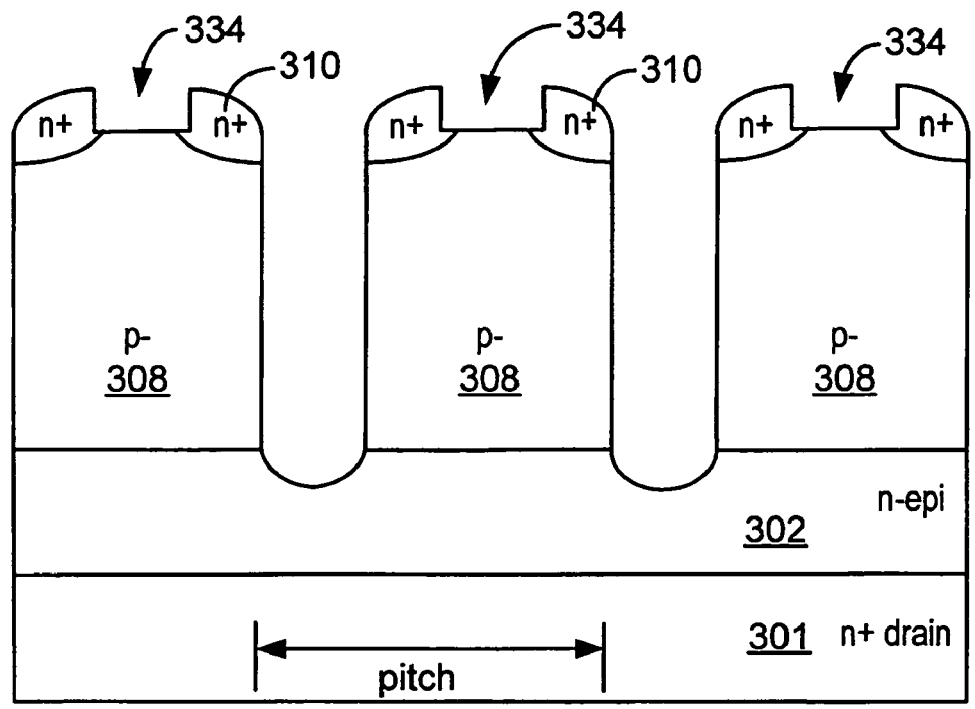

In FIG. 3E, using conventional techniques, remaining hard mask sections 309B are removed to thereby form heavy body contact openings 334. In the embodiment where the hard mask is from oxide, a conventional oxide etch is used to remove hard mask sections 309B. As can be seen, heavy body contact openings 334 are self-aligned to the trenches. Also, as with the first embodiment, contact openings 334 and the effective trench opening (i.e., the opening in which the gate dielectric and gate electrode are formed) are both far smaller than what photolithography tools are capable of resolving.

Figure 3F:
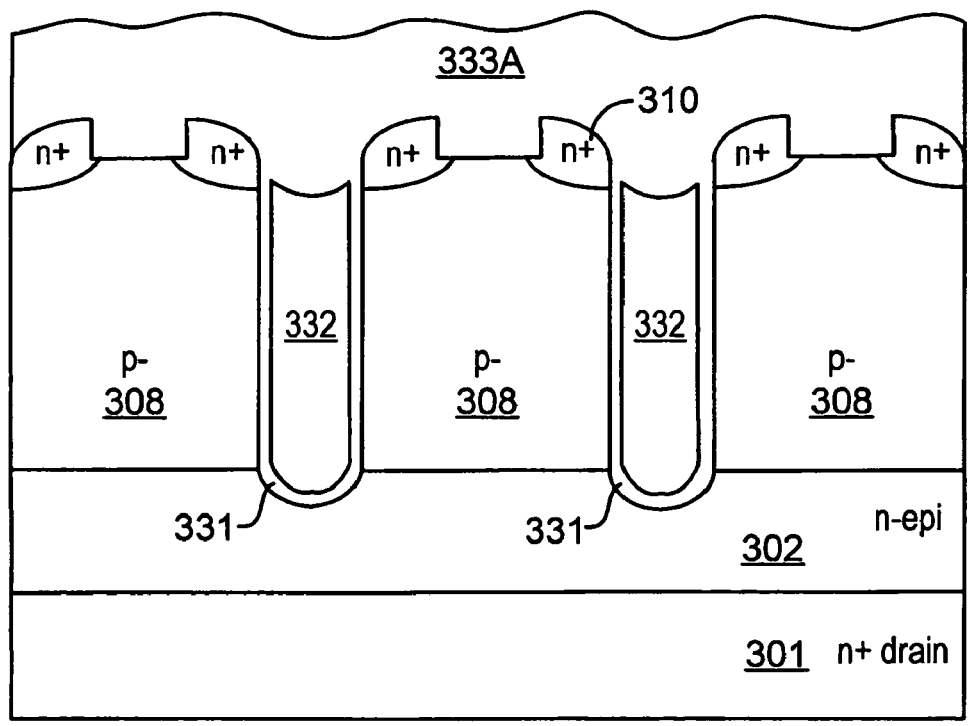
Figure 3G:
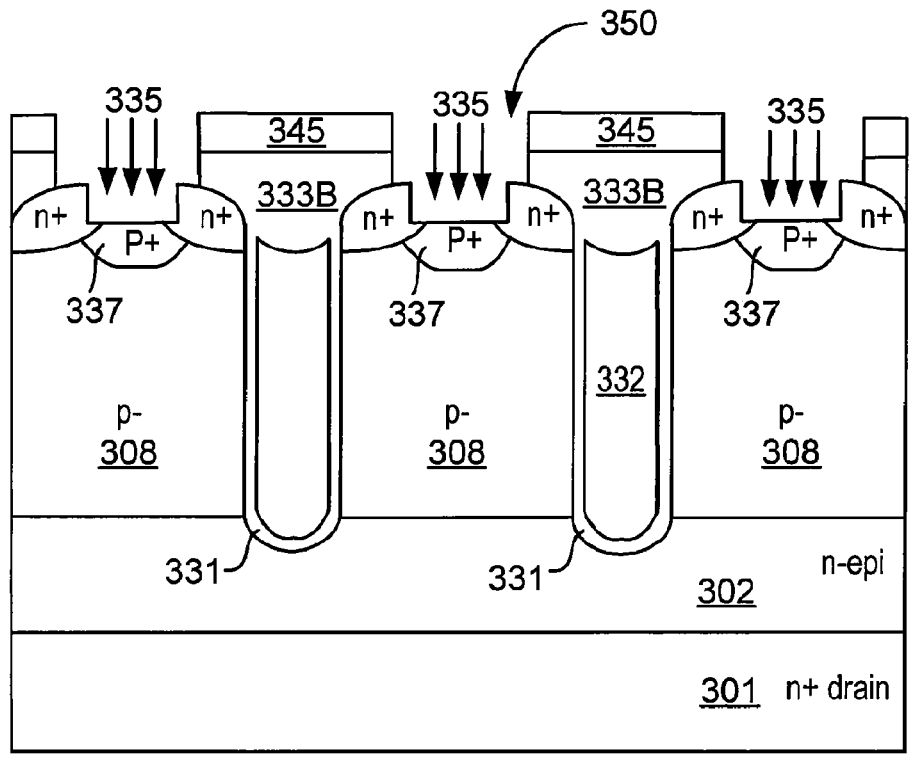
Figure 3H:
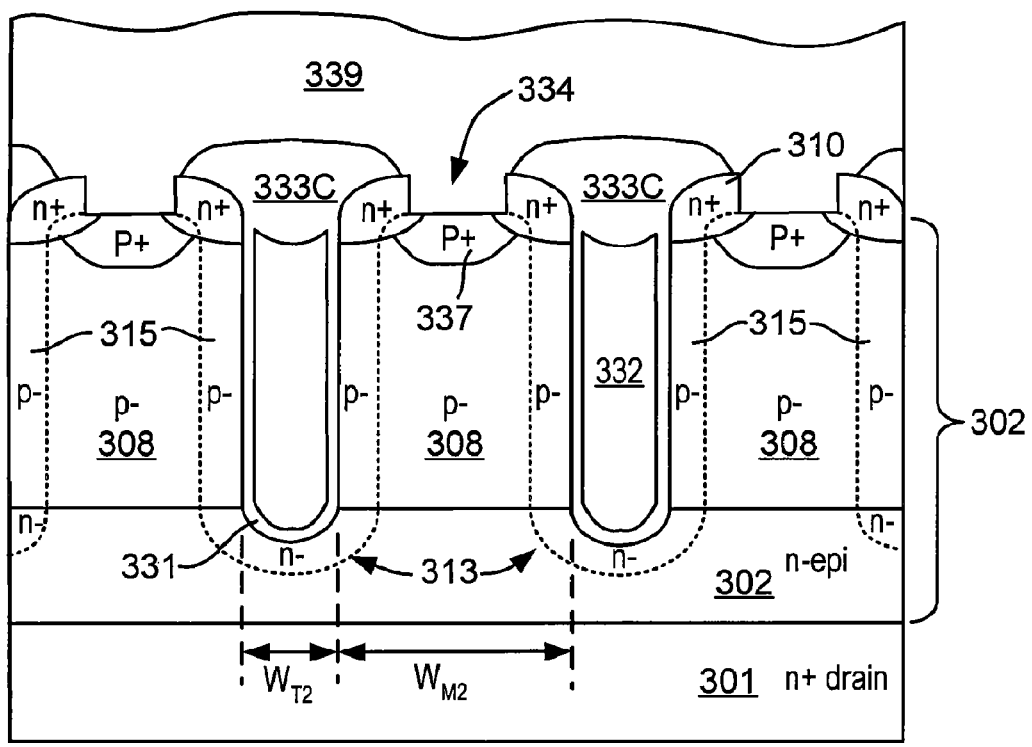

In FIG. 3F, a gate dielectric layer 331 (e.g., from oxide) and a recessed gate electrode 332 (e.g., from doped polysilicon) are formed in each trench over silicon layer 315 using conventional techniques. A dielectric layer 333A, such as BPSG, is then formed over the structure as described above in the step corresponding to FIG. 2D. In an alternate embodiment, the angled source implant is carried out after forming gate electrode 332 but prior to forming dielectric layer 333A. In yet another embodiment, the well implant and drive steps and the source implant step are sequentially carried out after forming the gate electrode 332 but before forming dielectric layer 331.

In FIG. 3G, portions of dielectric layer 333A over the contact opening, as defined by making layer 345 (e.g., from photoresist), are removed to thereby form larger openings 350. Openings 350 are wider than necessary, because of the pre-existing heavy body contact openings 334 (FIG. 3E). This substantially relaxes the misalignment tolerance on masking layer 345. A conventional implant step is then carried out to form heavy body regions 337 through openings 350.

The remaining portions of masking layer 345 are then removed, followed by a dielectric (e.g., BPSG) reflow process to obtain a better aspect ratio for the contact opening and a better step coverage for the metal layer that is to be formed next. A layer of metal 339 is formed over to electrically contact heavy body regions 337 and source regions 310.

While the above is a complete description of specific embodiments of the present invention, various modifications, variations, and alternatives may be employed. For example, although silicon is given as an example of a substrate material, other materials may be used. The invention is illustrated for a trench MOSFET, but it could easily be applied to other trench-gate structures such as IGBTs. Similarly, implantation is given as an example of introducing dopants, but other doping methods, such as a gas or topical dopant source may be used to provide dopants for diffusion, depending on the appropriate mask being used. The process sequences depicted by FIGS. 2A-2G and 3A-3H are for n-channel FETs, but modifying these process sequences to form p-channel FETs would be obvious to one skilled in the art in view of this disclosure. Also, while the trenches in both embodiments are shown to terminate within the epitaxial layer, the trenches may alternatively extend through the epitaxial layer and terminate within the substrate region. Further, the above manufacturing processes can be modified by one skilled in the art to include a thick bottom oxide (TBO) under the gate electrodes to reduce the gate-drain charge, or to include a shield electrode (e.g., from polysilicon) in each trench under but insulated from the gate electrode. Hence, the scope of this invention should not be limited to the embodiments described, but are instead defined by the following claims.

What is claimed is:

1. A method of forming a field effect transistor, comprising:
    forming openings in a masking layer extending over a surface of a silicon region;
    forming a trench in the silicon region through each opening in the masking layer;
    forming a layer of silicon along sidewalls and bottom of each trench and along masking layer sidewalls which define each opening;
    removing the masking layer to expose surface areas of the silicon region underlying the masking layer and to expose sidewalls of the layer of silicon to thereby form contact openings over the surface of the silicon region; and
    forming a contact layer to electrically contact the exposed surface areas of the silicon region and the exposed sidewalls of the layer of silicon.

2. The method of claim 1 wherein the masking layer comprises a composite layer of oxide-nitride-oxide (ONO).

3. The method of claim 1 further comprising:
    forming source regions extending into the silicon layer by implanting impurities at an angle greater than 20° from the dimension parallel to trench sidewalls.

4. The method of claim 1 wherein the layer of silicon is formed using a selective epitaxial growth (SEG) process.

5. The method of claim 1 wherein the masking layer includes a nitride layer, the method further comprising:
    forming a gate dielectric and a recessed gate electrode in each trench;
    forming a layer of dielectric over the trenches and the masking layer;
    etching the layer of dielectric until the nitride layer in the masking layer is exposed; and
    after the step of removing the masking layer, implanting dopants to form a heavy body region in the silicon region between adjacent trenches.

6. The method of claim 1 wherein the layer of silicon is undoped upon formation.

7. The method of claim 1 wherein the silicon region comprises a substrate of a first conductivity type and an epitaxial layer of the first conductivity type extending over the substrate, the method further comprising:
    prior to forming the trenches, forming a body region of the second conductivity type in the epitaxial layer, wherein the trenches are formed to extend through the body region and into the epitaxial layer, the layer of silicon being formed to have a doping concentration such that upon substantial formation of the field effect transistor a portion of the layer of silicon extending along the bottom of each trench is of the first conductivity type and portions of the layer of silicon extending along sidewalls of each trench are of the second conductivity type.

8. A method of forming a field effect transistor, comprising:
   forming openings in a masking layer extending over a surface of a silicon region;
   forming a trench in the silicon region through each opening in the masking layer;
   forming a layer of silicon along sidewalls and bottom of each trench and along masking layer sidewalls which define the openings in the masking layer; and
   removing the masking layer to thereby form contact openings over the surface of the silicon region for receiving a contact layer, the contact openings being defined by exposed sidewalls of the layer of silicon.

9. The method of claim 8, wherein the masking layer comprises an oxide-nitride-oxide composite layer.

10. The method of claim 8 wherein the masking layer includes a nitride layer, the method further comprising:
    forming a gate dielectric and a recessed gate electrode in each trench;
    forming a layer of dielectric over the trenches and the masking layer;
    etching the layer of dielectric until the nitride layer in the masking layer is exposed; and
    after removing the masking layer, implanting dopants through the contact openings to form a heavy body region in the silicon region between adjacent trenches.

11. The method of claim 8 further comprising:
    forming source regions extending into the silicon layer by implanting impurities at an angle greater than 20° from the dimension parallel to trench sidewalls.

12. The method of claim 11 wherein the silicon region comprises a substrate of a first conductivity type and an epitaxial layer of the first conductivity type extending over the substrate, the method further comprising:
    prior to forming the trenches, forming a body region of the second conductivity type in the epitaxial layer, wherein the trenches are formed to extend through the body region and into the epitaxial layer, the layer of silicon being formed to have a doping concentration such that upon substantial formation of the field effect transistor a portion of the layer of silicon extending along the bottom of each trench is of the first conductivity type and portions of the layer of silicon extending along sidewalls of each trench are of the second conductivity type.

13. A method of forming a field effect transistor, comprising:
    forming trenches in a silicon region using a masking layer, the trenches extending from a surface of the silicon region to a predetermined depth in the silicon region;
    removing portions of the masking layer to expose surface areas of the silicon region adjacent each trench;
    forming a layer of silicon along sidewalls and bottom of each trench, the layer of silicon extending out of each trench and over the exposed surface areas of the silicon region adjacent each trench, the layer of silicon abutting sidewalls of the masking layer remaining after the removing step; and
    removing the remaining masking layer to thereby form contact openings over the surface of the silicon region, the contact openings being defined by exposed sidewalls of the layer of silicon.

14. The method of claim 13 wherein the masking layer comprises oxide.

15. The method of claim 13 farther comprising:
    forming source regions extending into the silicon layer by implanting impurities at an angle greater than 20° from the dimension parallel to trench sidewalls.

16. The method of claim 13 wherein the layer of silicon is formed using a selective epitaxial growth (SEG) process.

17. The method of claim 13 farther comprising:
    forming a gate dielectric and a recessed gate electrode in each trench;
    after the step of removing the remaining masking layer, forming a layer of dielectric over the trenches and the contact openings;
    removing portions of the layer of dielectric from over the contact openings; and
    implanting dopants through the contact openings to form heavy body regions in the silicon region.

18. The method of claim 13 wherein the silicon region comprises a substrate of a first conductivity type and an epitaxial layer of the first conductivity type extending over the substrate, the method further comprising:
    prior to forming the trenches, forming a body region of the second conductivity type in the epitaxial layer, wherein the trenches are formed to extend through the body region and into the epitaxial layer, the layer of silicon being formed to have a doping concentration such that upon substantial formation of the field effect transistor a portion of the layer of silicon extending along the bottom of each trench is of the first conductivity type and portions of the layer of silicon extending along sidewalls of each trench are of the second conductivity type.

19. A method of forming a field effect transistor, comprising:
    forming a pair of trenches in a silicon region;
    forming a layer of silicon extending along sidewalls and bottom of each trench, the layer of silicon further extending out of each trench but being discontinuous over a surface of the silicon region so as to form a contact opening over the surface of the silicon region between the pair of trenches, the contact opening being formed without removing a portion of the layer of silicon; and
    through the contact opening, forming a heavy body region in the silicon region between the pair of trenches.

20. The method of claim 19 further comprising:
    forming source regions extending into the silicon layer by implanting impurities at an angle greater than 20° from the dimension parallel to trench sidewalls.

21. The method of claim 20 wherein the silicon region comprises a substrate of the first conductivity type and an epitaxial layer of the first conductivity type extending over the substrate, the method further comprising:
    prior to forming the trenches, forming a body region of the second conductivity type in the epitaxial layer, wherein the trenches are formed to extend through the body region and into the epitaxial layer, the layer of silicon being formed to have a doping concentration such that upon substantial formation of the field effect transistor a portion of the layer of silicon extending along the bottom of each trench is of the first conductivity type and portions of the layer of silicon extending along sidewalls of each trench are of the second conductivity type.

22. A field effect transistor comprising:
a pair of trenches in a silicon region; and
a layer of silicon extending along the sidewalls and bottom of each trench, the layer of silicon extending out of each trench but being discontinuous over a surface of the silicon region so as to form a contact opening over the surface of the silicon region between the pair of trenches, wherein the contact opening is self-aligned relative to the trenches.

23. The field effect transistor of claim 22 further comprising:
a gate dielectric layer lining sidewalls and bottom of the layer of silicon in each trench;
a gate electrode over the gate dielectric in each trench; and
source regions of a first conductivity type flanking each side of the gate electrode in each trench, wherein at least a portion of each source region is formed in the layer of silicon such that sidewalls of adjacent source regions define the contact opening.

24. The field effect transistor of claim 22 wherein the silicon region comprises:
a substrate of the first conductivity type;
an epitaxial layer of the first conductivity type extending over the substrate; and
a body region of the second conductivity type in the epitaxial layer, wherein the pair of trenches extend through the body region and into the epitaxial layer.

25. The field effect transistor of claim 24 wherein a portion of the layer of silicon extending along the bottom of each trench is of the first conductivity type, and portions of the layer of silicon extending along sidewalls of each trench are of the second conductivity type.

26. The field effect transistor of claim 22 further comprising:
a heavy body region in the silicon region directly below the contact opening, the heavy body region being self-aligned to the pair of trenches.

27. The field effect transistor of claim 22 further comprising a contact layer electrically contacting sidewalls of the layer of silicon and a surface of the silicon region defined by the contact opening.

28. A field effect transistor comprising:
a plurality of trenches in a silicon region;
a layer of silicon lining sidewalls and bottom of each trench, the layer of silicon extending out of each trench but being discontinuous over a surface of the silicon region so as to form a contact opening over the surface of the silicon region between adjacent trenches, wherein the contact opening is self-aligned relative to the trenches;
a gate dielectric layer lining sidewalls and bottom of the layer of silicon in each trench;
a gate electrode over the gate dielectric in each trench; and
source regions of a first conductivity type extending into the layer of silicon.

29. The field effect transistor of claim 28 wherein sidewalls of adjacent source regions define the contact openings.

30. The field effect transistor of claim 28 wherein the silicon region comprises:
a substrate of the first conductivity type;
an epitaxial layer of the first conductivity type extending over the substrate;
a body region of the second conductivity type in the epitaxial layer, wherein the plurality of trenches extend through the body region and into the epitaxial layer.

31. The field effect transistor of claim 28 further comprising a heavy body region of a second conductivity type in the silicon region directly below each contact opening, the heavy body regions being self-aligned to the plurality of trenches.

32. The field effect transistor of claim 28 further comprising a contact layer electrically contacting the heavy body regions and sidewalls of the layer of silicon.

* * * * *